(12) United States Patent
Takeishi et al.

(10) Patent No.: US 9,601,331 B2
(45) Date of Patent: *Mar. 21, 2017

(54) PATTERN FORMING METHOD AND MANUFACTURING METHOD OF SEMICONDUCTOR DEVICE

(71) Applicant: Kabushiki Kaisha Toshiba, Minato-ku, Tokyo (JP)

(72) Inventors: Tomoyuki Takeishi, Kawasaki (JP); Hirokazu Kato, Yokohama (JP); Shinichi Ito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/919,919

(22) Filed: Oct. 22, 2015

(65) Prior Publication Data

US 2016/0042942 A1 Feb. 11, 2016

Related U.S. Application Data

(60) Division of application No. 14/258,611, filed on Apr. 22, 2014, now Pat. No. 9,202,722, which is a division
(Continued)

(30) Foreign Application Priority Data

Jan. 15, 2004 (JP) ................................ 2004-008290

(51) Int. Cl.
*H01L 21/00* (2006.01)
*H01L 21/027* (2006.01)
(Continued)

(52) U.S. Cl.
CPC ............ *H01L 21/0276* (2013.01); *G03F 7/11* (2013.01); *G03F 7/168* (2013.01); *G03F 7/20* (2013.01);
(Continued)

(58) Field of Classification Search
None
See application file for complete search history.

(56) References Cited

U.S. PATENT DOCUMENTS 5,667,922 A 9/1997 Martiska et al.
6,372,413 B2 4/2002 Ema et al.
(Continued)

FOREIGN PATENT DOCUMENTS

JP 2-74948 3/1990
JP 4-206625 7/1992
(Continued)

OTHER PUBLICATIONS

Notification of Reasons for Rejection issued by the Japanese Patent Office on Jan. 17, 2006, for Japanese Patent Application No. 2004-008290, and English-language translation thereof.
(Continued)

*Primary Examiner* — Benjamin Sandvik
(74) *Attorney, Agent, or Firm* — Finnegan, Henderson, Farabow, Garrett & Dunner, LLP

(57) ABSTRACT

A pattern forming method includes forming a spin on dielectric film on a substrate, washing the spin on dielectric film by using a washing liquid, drying a surface of the spin on dielectric film after the washing, forming a photosensitive film on the dried coating type insulation film, emitting energy rays to a predetermined position of the photosensitive film in order to form a latent image on the photosensitive film, developing the photosensitive film in order to form a photosensitive film pattern which corresponds to the latent image, and processing the spin on dielectric film with the photosensitive film pattern serving as a mask.

24 Claims, 4 Drawing Sheets

Related U.S. Application Data of application No. 12/926,134, filed on Oct. 27, 2010, now Pat. No. 8,728,943, which is a continuation of application No. 11/034,975, filed on Jan. 14, 2005, now Pat. No. 7,851,363.

(51) Int. Cl.

| | | |
|---|---|---|
| *G03F 7/11* | (2006.01) | |
| *H01L 21/02* | (2006.01) | |
| *H01L 21/67* | (2006.01) | |
| *G03F 7/20* | (2006.01) | |
| *G03F 7/32* | (2006.01) | |
| *G03F 7/16* | (2006.01) | |
| *H01L 21/033* | (2006.01) | |
| *H01L 21/311* | (2006.01) | |

(52) U.S. Cl.
CPC .............. *G03F 7/2041* (2013.01); *G03F 7/32* (2013.01); *H01L 21/02052* (2013.01); *H01L 21/67023* (2013.01); *G03F 7/162* (2013.01); *H01L 21/0332* (2013.01); *H01L 21/31144* (2013.01)

(56) References Cited

U.S. PATENT DOCUMENTS

| | | | |
|---|---|---|---|
| 6,383,723 B1 | 5/2002 | Iyer et al. | |
| 6,428,894 B1 | 8/2002 | Babich et al. | |
| 6,742,944 B2 | 6/2004 | Takahashi et al. | |
| 6,788,477 B2 | 9/2004 | Lin | |
| 7,851,363 B2 * | 12/2010 | Takeishi | G03F 7/11 438/694 |
| 9,202,722 B2 * | 12/2015 | Takeishi | G03F 7/11 |
| 2001/0024765 A1 | 9/2001 | Okazaki et al. | |
| 2003/0062599 A1 | 4/2003 | Egami et al. | |
| 2003/0064609 A1 | 4/2003 | Iseki et al. | |
| 2004/0002784 A1 | 1/2004 | Yoshida et al. | |
| 2004/0043310 A1 | 3/2004 | Takeishi et al. | |
| 2004/0121606 A1 | 6/2004 | Raskin et al. | |
| 2004/0137711 A1 | 7/2004 | Deguchi | |

FOREIGN PATENT DOCUMENTS

| | | |
|---|---|---|
| JP | 4-290012 | 10/1992 |
| JP | 6-84787 | 3/1994 |
| JP | 6-124873 | 5/1994 |
| JP | 8-51061 | 2/1996 |
| JP | 2001-127033 | 5/2001 |

OTHER PUBLICATIONS

Wolf, "Silicon Processing for the VLSI Era," Lattice Press (2000), 1:141 and 524-526.

Quirk, "Semiconductor Manufacturing Technology," Prentice-Hall (2001), pp. 345-347.

\* cited by examiner

PATTERN FORMING METHOD AND MANUFACTURING METHOD OF SEMICONDUCTOR DEVICE

CROSS-REFERENCE TO RELATED APPLICATIONS

This is a divisional of application Ser. No. 14/258,611, filed Apr. 22, 2014, which is a divisional of application Ser. No. 12/926,134, filed Oct. 27, 2010, which is a continuation of application Ser. No. 11/034,975, filed Jan. 14, 2005. The disclosures of the above-referenced applications are incorporated herein by reference.

This application is based upon and claims the benefit of priority from prior Japanese Patent Application No. 2004-008290, filed Jan. 15, 2004, the entire contents of which are incorporated herein by reference.

BACKGROUND OF THE INVENTION

1. Field of the Invention

The present invention relates to a pattern forming method for use in processing a substrate such as a semiconductor substrate, a glass substrate, and a resin substrate.

2. Description of the Related Art

In recent years, there has been a growing demand for highly integrated LSIs. Concurrently, there has been a demand for a processing technique with very high precision for forming a fine device pattern of 100 nm or less in a semiconductor lithography technique. Therefore, in a pattern exposure apparatus, high resolution is accelerated by producing short wavelengths with an excimer laser for use in KrF→ArF→$F_2$. On the other hand, with more fining, pattern breakage of a resist film cannot be ignored. Therefore, a multilayer resist process for preventing pattern breakage by reducing the film thickness of a chemically amplified resist is used.

For example, as described in Jpn. Pat. Appln. KOKAI Publication No. 6-84787, there has been a problem that an upper-layered resist pattern falls (is released) in a multilayer resist process. In Jpn. Pat. Appln. KOKAI Publication No. 6-84787, it has been reported that an SOG film surface is temporarily subjected to hydrophobic processing, and then, a chemically amplified resist is formed, thereby restricting release of the resist pattern. However, this method has proved insufficient, although a certain advantageous effect is attained in restricting the release of the resist pattern.

As described above, in the multilayer resist process, there has been a problem that an upper-layered resist pattern is released/falls.

BRIEF SUMMARY OF THE INVENTION

According to an aspect of the present invention, there is provided a pattern forming method comprising: forming a spin on dielectric film on a substrate; washing the spin on dielectric film by using a washing liquid; drying a surface of the spin on dielectric film after the washing; forming a photosensitive film on the dried spin on dielectric film; emitting energy rays to a predetermined position of the photosensitive film in order to form a latent image on the photosensitive film; developing the photosensitive film in order to form a photosensitive film pattern which corresponds to the latent image; and processing the coating type insulation film with the photosensitive film pattern serving as a mask.

According to another aspect of the present invention, there is provided a pattern forming method comprising: preparing a first substrate; forming a photosensitive film on the first substrate; washing the photosensitive film by using a first washing liquid; emitting energy rays to a predetermined position of the photosensitive film by using an immersion type exposure in order to form a latent image on the photosensitive film after washing the photosensitive film; developing the photosensitive film in order to form a photosensitive film pattern which corresponds to the latent image; and processing the first substrate with the photosensitive film pattern serving as a mask.

DETAILED DESCRIPTION OF THE INVENTION

Hereinafter, embodiments of the present invention will be described with reference to the accompanying drawings.

First Embodiment

The first embodiment describes a pattern forming method in a three-layer resist process. In this three-layered film, an anti-reflection film made of carbon is defined as a lower-layered film; an SOG film (spin on dielectric film) is defined as an intermediate film; and a chemically amplified resist film (photosensitive film) is defined as an upper-layered film. Hereinafter, a pattern forming method for a chemically amplified resist film which is an upper-layered film in the three-layer resist process will be specifically described.

FIGS. 1A to 1G are sectional views each showing procedures in a pattern forming method according to a first embodiment of the present invention.

Figure 1A:
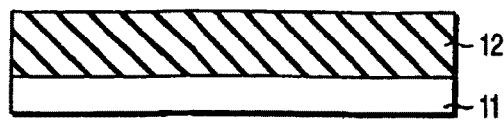
FIGS. 1A to 1G are sectional views each showing procedures in a pattern forming method according to a first embodiment.

First, a solution including an anti-reflection material is coated on a substrate 11 with a spin coating technique. As shown in FIG. 1A, heating is carried out under a condition of 300° C. for 120 seconds, whereby an anti-reflection film 12 of 300 nm in film thickness is formed on the substrate 11. In addition, spun-on C made of carbon, for example, is used for the anti-reflection film 12.

Figure 1B:
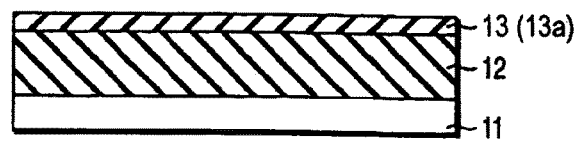

Next, in order to form an intermediate film, a spin on dielectric material 13a is coated on the anti-reflection film 12 with the spin coating technique. As shown in FIG. 1B, heating is carried out under a condition of 350° C. for 120 seconds, whereby an SOG film 13 of 50 nm in film thickness is formed on the anti-reflection film 12.

Figure 1C:
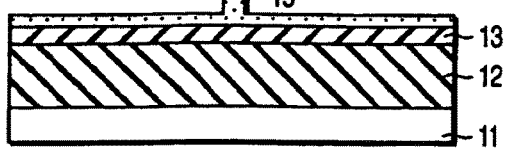

Next, as shown in FIG. 1C, in order to wash a surface of the SOG film 13, pure water (ultra-pure water) 15 is supplied from a nozzle 14 onto the SOG film 13 while the substrate 11 is rotated. A washing process is carried out for 60 seconds. The surface of the SOG film 13 is dried with a spin drying technique.

Figure 1D:
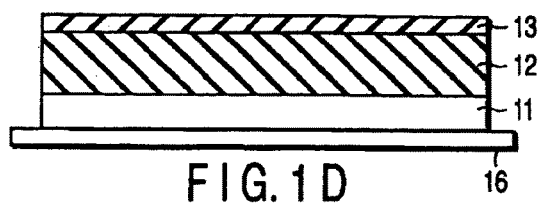

Next, as shown in FIG. 1D, the substrate 11 is placed on a hot plate 16. The substrate 11 is heated under a condition of 200° C. for 60 seconds, whereby a water molecule adsorbed onto the surface of the SOG film 13 is removed. This heating process may be omitted if there is no necessity.

Figure 1E:
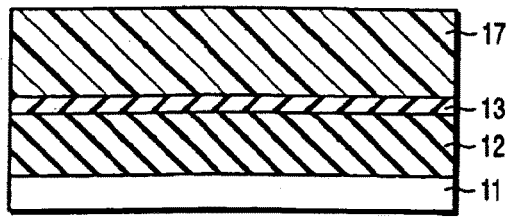

Next, a coating material for ArF light (193 nm in wavelength) chemically amplified positive resist film is coated onto the SOG film 13 with the spin coating technique. As shown in FIG. 1E, by heating at 120° C. for 60 seconds, a resist film 17 of 200 nm in film thickness is formed on the SOG film 13.

Figure 1F:
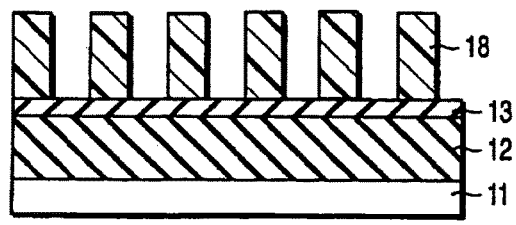

Next, a pattern formed on an exposure reticle by using an ArF excimer laser is reduced, projected, and exposed to the resist film 17, whereby a latent image is formed on the resist film 17. The substrate 11 is heat-treated under a condition of 130° C. for 60 seconds. The substrate 11 is transported to a developing device. Due to a developing liquid being supplied onto the resist film 17, a developing process is started. After 30 seconds, in order to stop the developing process and washing, pure water is supplied onto the substrate 11. After stopping supply of the pure water, the surface of the resist film 17 is dried with a spin drying technique. By carrying out these processes, as shown in FIG. 1F, a 1:1 line and space pattern 18 is formed on the substrate 11.

A cross section of the resist pattern formed with the above processes was observed by using a scanning electronic microscope (SEM). In a pattern of 70 nm in dimensions of the 1:1 line and space pattern 18 as well, a resist pattern fall/release was not observed on a boundary surface between the resist film 17 and the SOG film 13, and it was verified that a vertical pattern was formed.

Figure 1G:
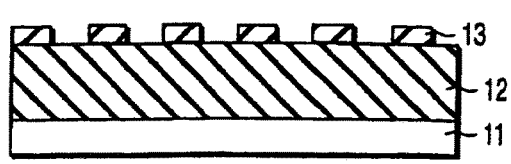

Next, as shown in FIG. 1G, the SOG film 13 is patterned with the line and space pattern 18 being a mask. In general, the line and space pattern 18 is eliminated while the SOG film 13 is etched. Then, with the SOG film as a mask, the anti-reflection film 12 and the substrate 11 are sequentially etched and patterned.

Figure 2:
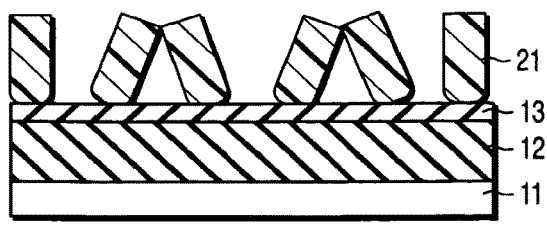
FIG. 2 is a sectional view schematically showing a pattern release when a pattern has been formed in a conventional three-layer resist process.

On the other hand, as carried out in a conventional three-layer resist process, a chemically amplified resist film was formed on the SOG film 13 without carrying out a process of washing the SOG film with pure water, and then, a pattern was reduced, projected, exposed by using the ArF excimer laser, and developed, whereby a 1:1 line and space pattern 21 was formed. A cross section of the formed resist pattern was observed by using the scanning electronic microscope (SEM). In a pattern of 100 nm or less in dimensions of the 1:1 line and space pattern 21, thinning was observed at a lower end of the pattern 21, and much of the line and space pattern 21 was released on a boundary surface between the pattern 21 and the SOG film 13 (FIG. 2).

As has been described above, a semiconductor device fabricated by processing for a mask the pattern 18 produced by using the method described in the first embodiment successfully processed a pattern which is finer than a semiconductor device fabricated without carrying out this process, and yield was successfully improved.

In a spin on dielectric material, in addition to a resin serving as a film framework, a subsidiary component other than a resin is contained for the purpose of enhancing preservation stability of the spin on dielectric material. When the spin on dielectric material is coated and sintered to form a film on the substrate, segregation in which this subsidiary component has been segregated is formed in the vicinity of the surface of the SOG film. Next, after a chemically amplified resist film has been formed on this segregated layer, when a desired pattern is reduced, projected, exposed, and developed, the subsidiary component contained in the segregated layer diffuses into the chemically amplified resist film, and a resist pattern bottom part is decomposed. In this manner, there occurs a resist pattern release on a boundary surface between the chemically amplified resist and the SOG as shown in FIG. 2.

Therefore, as in the present embodiment, after forming the SOG film, the surface is washed by pure water, whereby the subsidiary component which is excessively segregated in the SOG film top layer can be eliminated. In this manner, the degree of diffusion of the subsidiary component into the chemically amplified resist can be restricted, and a resist pattern release on the boundary surface between the chemically amplified resist and the SOG film can be restricted.

Further, in the present embodiment, although pure water was used as a wash chemical for the SOG film, the wash chemical is not limited to the pure water. In particular, it is more effective to use ozone water or hydrogen peroxide water. Since these chemicals have oxidization properties, the subsidiary component is oxidized and decomposed, whereby advantageous effect of eliminating the subsidiary component segregated on the SOG top layer is enhanced more significantly. In the case where the ozone water was used for wash water, a resist pattern release produced on the boundary surface between the resist and the SOG film was not observed even in a fine 1:1 line and space pattern of 60 nm in dimension.

Furthermore, in the present embodiment, after terminating the process of washing the SOG film, a heating process is carried out under a condition of 200° C. for 60 seconds in order to eliminate a water molecule adsorbed to the SOG film top layer. However, the heating process condition is not limited thereto. A heating temperature and a heating time will suffice if they can eliminate the water molecule adsorbed to the SOG film top layer. However, the subsidiary component can be removed by the washing process only in the vicinity of the SOG top layer. Therefore, there is a danger that, if the heating temperature is excessively high, the subsidiary component remaining in the SOG film is segregated again on the SOG film top layer during the heating process. Accordingly, it is desirable that the heating process temperature for eliminating the adsorbed water be equal to lower than at least the film forming temperature of the SOG film. In addition, the heating process condition may be properly selected according to type of the SOG film to be used. Further, this heating process may be omitted if there is no necessity.

Although the present embodiment has described a case of the SOG film, a material which is effective to the present embodiment is not limited thereto. Specifically, the embodiment is effective to a material classified into the publicly known spin-on dielectric (SOD) film.

Moreover, although a chemically amplified resist which has reactivity with ArF was used as a resist for use in the present embodiment, similar advantageous effect was attained for another alicyclic resin (acrylic based, cyclo olefin methyl adamantine (coma) based, and hybrid based resins) as well without being limited thereto. In addition, the embodiment is also effective to a resin having an aromatic compound. Further, advantageous effect was verified with respect to an i-beam or g-beam resist having a novolac resin; a KrF resist composed of a resin having a polyvinylphenol framework; an electron beam exposure resist; or a soft X-ray (EUV) exposure resist as well.

Second Embodiment

In the second embodiment, as in the first embodiment, a description will be given with respect to a pattern forming method for forming a resist pattern even in a state in which a segregated layer has formed on an SOG film top layer. A multi-layered film having a three-layer structure is formed on a substrate. In this multi-layered film, an anti-reflection film made of carbon is defined as a lower-layered film; an SOG film is defined as an intermediate film; and a chemically amplified resist film is defined as an upper-layered film. Hereinafter, a specific description will be given with respect to a method for forming a pattern of a chemically amplified resist layer which is an upper-layered film in the three-layer structure.

FIGS. 3A to 3E are sectional views each showing procedures in a pattern forming method according to a second embodiment of the present invention.

Figure 3A:
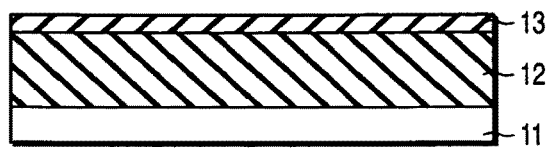
FIGS. 3A to 3E are sectional views each showing procedures in a pattern forming method in a second embodiment.

First, as shown in FIG. 3A, as in the first embodiment, an anti-reflection film 12 and an SOG film 13 are formed on a substrate 11.

Figure 3B:
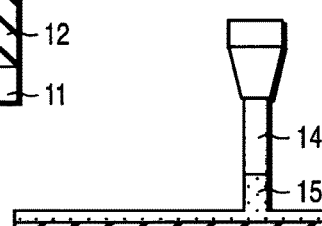

Next, as shown in FIG. 3B, in order to carry out a washing process of a surface of the SOG film 13, pure water 15 is supplied onto the SOG film 13 while the substrate 11 is rotated. The washing process is carried out for 60 seconds. After the washing process, the SOG film 13 is dried with a spin drying technique.

Figure 3C:
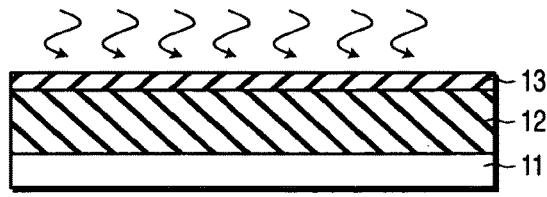

Next, as shown in FIG. 3C, in order to carry out hydrophobic processing of the surface of the SOG film 13, the substrate 11 is processed to be heated under a condition of 100° C. for 60 seconds in a processing unit filled with hexamethyl disilazane steam.

Figure 3D:
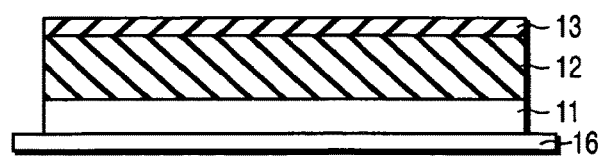
Figure 3E:
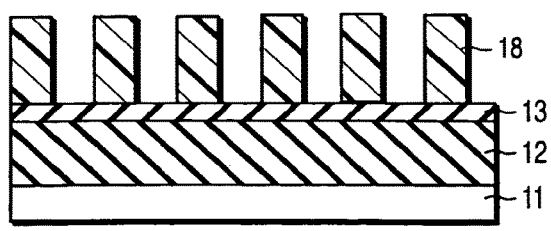

Next, as shown in FIG. 3D, a water molecule adsorbed to the surface of the SOG film 13 is removed by heating the substrate under a condition of 200° C. for 60 seconds. Through a process similar to that of the first embodiment, as shown in FIG. 3E, a line and space pattern 18 is formed. Further, with the pattern 18 as a mask, the SOG film 13 and the substrate 11 are etched.

When a cross section of the pattern 18 formed with the above processes was observed by using a scanning electronic microscope (SEM), even if dimensions of the 1:1 line and space pattern 18 was 60 nm, a resist pattern release was not observed on a boundary surface between the resist film and the SOG film, and a vertical pattern 18 was formed.

As has been described above, a semiconductor device fabricated by processing for a mask the resist pattern produced by using the method described in the second embodiment successfully processed a pattern which is finer than a semiconductor device fabricated without carrying out this process, and yield was successfully improved.

In the present embodiment, after terminating the process of washing the SOG film, a hydrophobic processing for the SOG top layer is carried out by exposure to hexamethylene disilazane steam. An organic film including an ArF chemically amplified positive resist film is highly hydrophobic. By performing the hydrophobic processing for the SOG film after the subsidiary component has been removed in accordance with the washing process, when a next chemically amplified resist film is formed on the SOG film, coherence between the chemically amplified resist film and the SOG film is improved. Thus, the advantageous effect that a resist pattern release can be restricted more significantly. Moreover, with the present embodiment, hydrophobic process is performed after the washing and heating process is carried out after that. However, a processing order is not limited to this. For example, it is also possible to use as the order of washing processing, heating processing, and hydrophobic processing.

Figure 4:
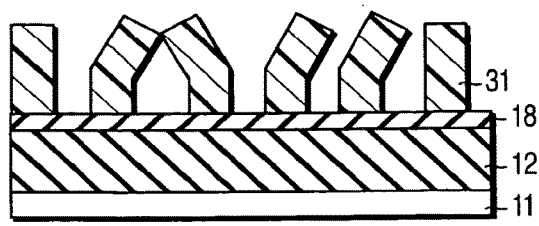
FIG. 4 is a view schematically showing a resist pattern breakage phenomenon which occurs due to shortage of resist strength.

In addition, in the present embodiment, although pure water was used as a wash chemical for the SOG film, the wash chemical is not limited to the pure water. In particular, it is more effective to use ozone water or hydrogen peroxide water. Since these chemicals oxidize and decompose the subsidiary component, and the SOG resin itself is oxidized, a hydroxide group or a carboxylic group is produced on the surface of the SOG film 13. In this manner, the surface of the SOG film 13 becomes hydrophilic, and there is a danger that some resist resins to be used lowers coherence with the SOG film. Therefore, the hydroxide group or carboxylic group formed on the SOG resin top layer can be eliminated by carrying out the hydrophilic process after terminating the washing process, and the coherence with the SOG film can be maintained. For example, in the case where the ozone water was used for wash water, even in a fine 1:1 line and space pattern of 55 nm in dimension, a resist pattern release produced on a boundary surface between the resist and the SOG film was not observed. However, as shown in FIG. 4, in a pattern 31 of less than 60 nm, a pattern breakage phenomenon occurred due to breakage of the resist produced by insufficient strength of the resist (FIG. 4).

In the present embodiment, the hydrophobic processing for the SOG film top layer is carried out after washing the SOG film surface. Thus, a heating process is carried out under a condition of 100° C. for 60 seconds in a processing unit filled with hexamethylene disilazane steam. However, the heating process condition is not limited thereto. An optimal processing condition may be properly selected such that a resist pattern does not break according to a material for a resist film or an intermediate film to be used. In addition, other silazanes, chlorosilanes, or alkoxysilanes be selected for the hydrophobic processing without being limited to hexamethylene disilazane as long as it is properly optimal.

In the present embodiment, after the hydrophobic processing for the SOG film, a heating process is carried out under a condition of 200° C. for 60 seconds in order to remove a water component adsorbed to the SOG film top surface. However, the heating process condition is not limited thereto. As in the first embodiment, an optimal heating process condition such as a temperature and time under which the water molecule adsorbed to the SOG film top layer and which is properly optimal according to the type of SOG film may be selected. Further, this heating process may be omitted if there is no necessity.

Although the embodiment has described a case of the SOG film, a material for which the processing described in the embodiment is efficient is not limited thereto. Specifically, the present embodiment is effective to a material classified into a publicly known SOD film.

In addition, although a chemically amplified resist which has reactivity with ArF was used as a resist for use in the present embodiment, similar advantageous effect was attained for another alicyclic resin (acryl based, coma based, or hybrid based resin). Further, advantageous effect was verified with respect to an i-beam or g-beam resist having a novolac resin; a KrF resist composed of a resin having a polyvinylphenol framework; an electron beam exposure resist; or a soft X-ray (EUV) exposure resist as well.

Third Embodiment

The present embodiment describes a pattern forming method when a resist pattern is formed by a liquid impregnation type projecting and exposure apparatus. Here, as is the above-described embodiments, a pattern forming method in a three-layer resist process will be described. An anti-reflection film made of carbon is defined as a lower-layered film, an SOG film is defined as an intermediate film, and a chemically amplified resist is defined as an upper-layered film.

In the first and second embodiments, after washing the SOG film surface, a resist film was formed. As in washing the SOG film, when a resist film surface before developing the resist film was washed, an advantageous effect was attained for improvement of dimensional uniformity of a pattern after developed or for restriction of line edge roughness. An embodiment of washing the surface of the resist film will be described below.

FIGS. 5A to 5G are sectional views each showing procedures in a pattern forming method according to a third embodiment of the present embodiment.

Figure 5A:
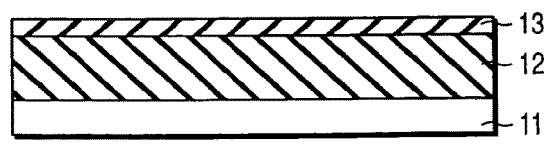
FIGS. 5A to 5G are sectional views each showing procedures in a pattern forming method according to a third embodiment.

As shown in FIG. 5A, as in the first embodiment or the second embodiment, an anti-reflection film 12 and a SOG film 13 are sequentially formed on a target substrate 11.

Figure 5B:
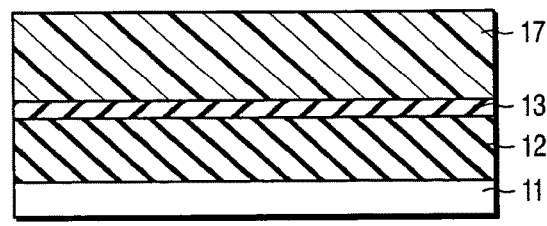

Then, as shown in FIG. 5B, ArF light (193 nm in wavelength) chemically amplified positive resist material is coated on the SOG film 13 in accordance with a spin coating technique, and then, heating is carried out at 120° C. for 60 seconds, thereby forming a chemically amplified positive resist film 17 of 200 nm in film thickness.

Figure 5C:
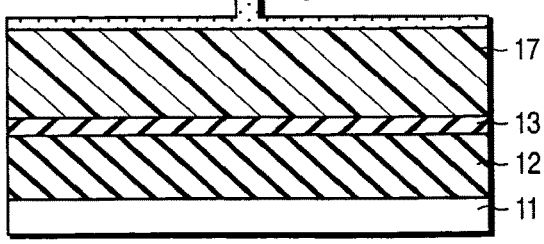

Next, as shown in FIG. 5C, in order to wash the surface of the chemically amplified positive resist film 17, pure water 15 is supplied onto the chemically amplified positive resist film 17 while the target substrate 11 is rotated. The washing process is carried out for 60 seconds. After the washing process, the surface of the chemically amplified positive resist film 17 is dried in accordance with a spin drying technique.

Figure 5D:
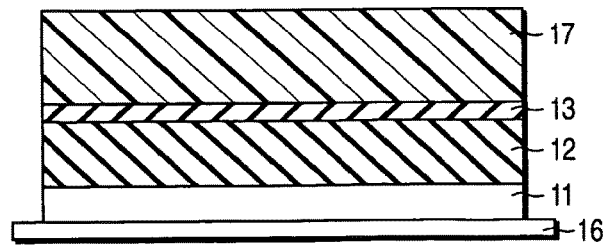

Subsequently, as shown in FIG. 5D, the target substrate 11 is placed on a hot plate 16. In order to remove a water molecule adsorbed to the surface of the chemically amplified positive resist film 17, the substrate 11 is heated under a condition of 130° C. for 60 seconds.

Figure 5E:
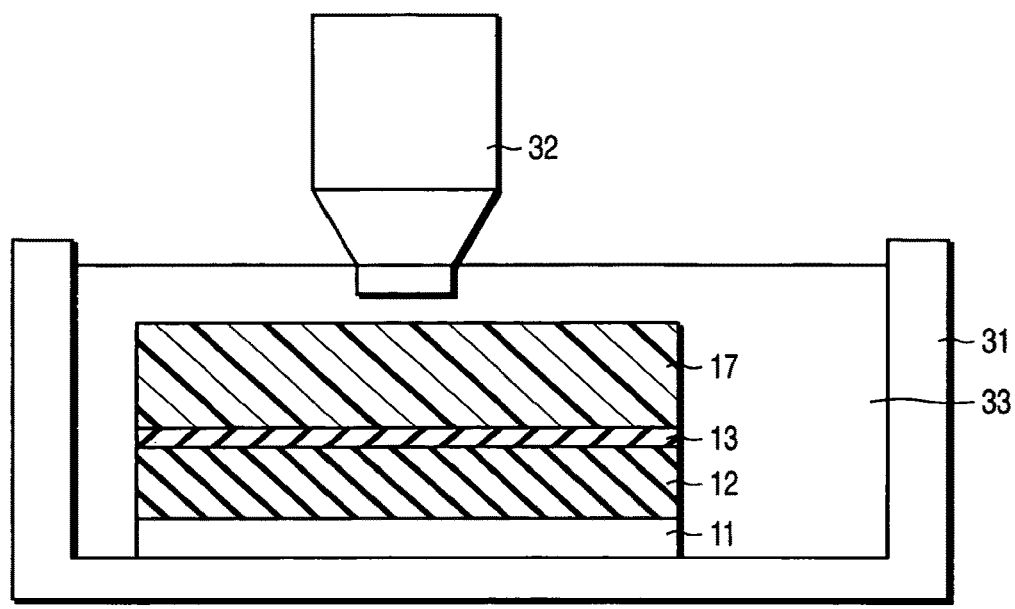

Next, in a liquid impregnation type projecting and exposure apparatus described in Jpn. Pat. Appln. KOKAI Publication No. 6-124873, a desired pattern provided on a reticle is transferred to the positive resist film 17 by using an ArF excimer laser, and a latent image is formed on the positive resist film 17. For example, as shown in FIG. 5E, the substrate 11 is placed in a liquid tank 31, and a pattern is projected, and exposed on the positive resist film 17 via a water layer 33 formed in an optical path between the chemically amplified positive resist film 17 and an optical system 32 of the projecting and exposure apparatus.

Figure 5F:
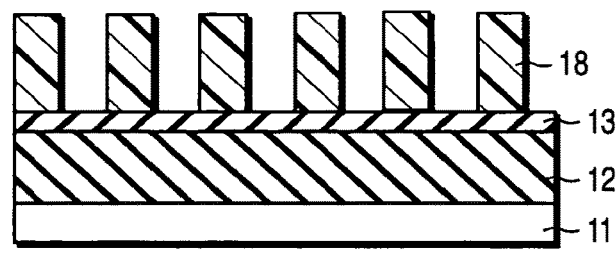

The substrate 11 is heat-treated under a condition of 130° C. for 60 seconds. The substrate 11 is transported to a developing device. The developing liquid is supplied onto the resist film 17, whereby a developing process is started. After 30 seconds, in order to stop the developing process and washing, pure water is supplied onto the rotating target substrate 11. After stopping supply of the pure water, the surface of the resist film 17 is dried in accordance with the spin drying technique. By carrying out this processing, as shown in FIG. 5F, a 1:1 line and space pattern 18 of 90 nm in thickness is formed on the substrate 11.

Figure 5G:
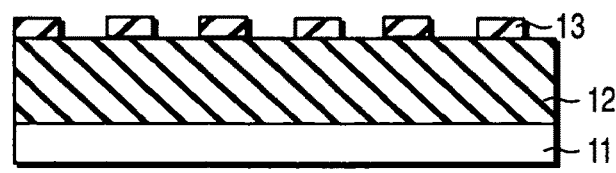

Subsequently, as shown in FIG. 5G, with the pattern 18 of the resist film being a mask, the SOG film 13 is patterned. In general, while the SOG film 13 is etched, the pattern 18 is eliminated. Then, with the SOG film 13 being a mask, the anti-reflection film 12 and the target substrate 11 are sequentially etched and patterned.

In accordance with the above process, the uniformity of the dimensions in the substrate surface of the formed pattern 18 was 3 nm in 3σ. In addition, when dispersion in line edge roughness of the pattern 18 was measured, 3σ was 1.5 nm in a conventional method. On the other hand, as is carried out in a three-layer resist process using a conventional immersion exposure apparatus, when a 1:1 line and space pattern of 90 nm was formed by reducing, projecting, exposing, and developing a pattern without carrying out the washing process for the chemically amplified positive resist film with pure water, the uniformity of the dimensions in the target substrate surface of the resist pattern was 7 nm in 3σ. Further, the dispersion in line edge roughness of the resist pattern was 4 nm in 3σ.

As has been described above, a semiconductor device fabricated using the method described in the present embodiment has an improved yield more than a semiconductor device fabricated without carrying out this method. In addition, the reliability of the device was successfully enhanced.

Some chemically amplified positive resist material contains an optical acid generating material or the like which is decomposed when light is emitted and which generates a strong acid, in addition to a resin which becomes a film framework. If a heating process is carried out after exposure, a resist resin is decomposed by an action of the acid produced from an optical acid generating material, whereby a light emitting portion becomes soluble to a developing liquid. As a result, a resist pattern is formed. The optical acid generating material is segregated on the surface of the chemically amplified resist film when the chemically amplified resist film is coated to form an film on the substrate. However, during immersion exposure, the optical acid generating material is dissolved in the liquid contained in the liquid tank provided between the substrate and a projecting optical system. As in a general exposure apparatus, when exposure was carried out by a step and repeat operation, liquidation occurs with the liquid. Thus, the optical acid generating material dissolved according to the liquid liquidation also liquidates, and the optical acid generating material is localized on the chemically amplified resist film surface. Next, when the heating process and developing process are carried out while the optical acid generating material is localized on the surface of the substrate, the resist resin of the light emitting portion is dissolved according to the amount of the optical acid generating material localized on the surface of the substrate, and a resist pattern is formed. Thus, the dimensional uniformity in the substrate surface of the chemically amplified resist pattern deteriorates.

Therefore, as in the embodiment, the washing process is carried out with pure water after forming the chemically amplified resist film, the optical acid generating material excessively segregated in the top layer of the chemically amplified resist film can be removed. In this manner, the dimensional uniformity or line edge roughness in the surface of the substrate of the chemically amplified resist pattern can be improved as compared with the conventional method.

The present embodiment has described a case in which the chemically amplified resist surface was washed before immersion exposure by using the immersion type projecting and exposure apparatus. However, the effectiveness of the present invention is not limited to washing the surface of the chemically amplified resist. The liquid impregnation exposure process includes a process for forming a protective film in a resist film in order to prevent water penetration into the chemically amplified resist or pattern deterioration due to dissolution of the substance included in the resist film into water. However, even such a protective film cannot eliminate effect of water perfectly. Therefore, as in the present invention, the surface of the protection film formed on the chemically amplified resist is washed before immersion or exposure, whereby the dimensional uniformity or line edge roughness in the surface of the substrate can be improved as compared with a case in which no washing process has been carried out.

The embodiment has described a pattern forming method when a resist pattern is formed by using a immersion type projecting and exposure apparatus. However, the effectiveness of the present invention is not limited to a case of using the immersion type exposure apparatus. Even in the case where a resist pattern is formed by using a general exposure apparatus and in the case where a desired pattern is reduced, projected, and exposed after carrying out the washing process after forming the chemically amplified resist film, the dimensional uniformity or line edge roughness in the surface of the substrate can be improved as compared with a case in which no washing process has been carried out.

Further, in the embodiment, pure water was used as a washing chemical for the chemically amplified resist film, the washing chemical is not limited thereto. In particular, the present invention is more effective in the case where ozone water or hydrogen peroxide water was used. Since these chemicals have oxidization properties, the subsidiary component is oxidized and decomposed, whereby advantageous effect of eliminating the subsidiary component segregated on the top layer of the chemically amplified resist is enhanced more significantly. The dimensional uniformity or line edge roughness in the surface of the target substrate is improved more significantly.

Furthermore, in the embodiment, after terminating the process of washing the chemically amplified resist film, in order to remove the water molecule adsorbed to the top layer of the chemically amplified resist film, a heating process is carried out under a condition of 130° C. for 60 seconds. However, the heating process condition is not limited thereto. Any heating temperature or heating time may be used as long as it can remove the water molecule adsorbed to the top layer of the chemically amplified resist film.

Although the present embodiment has described a case of the SOG film, a material for which the present invention is effective is not limited thereto. Specifically, the invention is effective to a material classified into a publicly known SOD film.

Moreover, although the chemically amplified resist having reactivity with ArF light was used as a resist for use in the present embodiment, a similar advantageous effect was attained for another alicyclic resin (acryl based, coma based, or hybrid based resin) without being limited thereto. In addition, the present invention is also effective to a resin having an aromatic compound. Further, the advantageous effect was verified with respect to an i-beam or g-beam resist having a novolac resin; a KrF resist composed of a resin having a polyvinylphenol framework; an electron beam exposure resist; or a soft X-ray (EUV) exposure resist as well.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device manufacturing method comprising:
   preparing a first substrate above which a first film having a photosensitive film is formed;
   supplying a first washing liquid to an entire top surface of the first film before using an exposure apparatus to emit energy rays to the photosensitive film, the photosensitive film being a chemically amplified resist film which contains an optical acid generating material;
   emitting energy rays to the photosensitive film using the exposure apparatus after the supplying of the first washing liquid to the entire top surface of the first film; and
   developing the photosensitive film in order to form a photosensitive film pattern,
   wherein a planarization of the photosensitive film above the first substrate is unchanged during the supplying the first washing liquid to the entire top surface of the first film.

2. The method according to claim 1, wherein the exposure apparatus is an immersion type exposure apparatus.

3. The method according to claim 2, wherein the first washing liquid is a pure water.

4. The method according to claim 2, wherein the first film comprises an anti-reflection film below the photosensitive film.

5. The method according to claim 2, further comprising drying the top surface of the first film after the supplying the first washing liquid to the entire top surface of the first film before the using the exposure apparatus.

6. The method according to claim 2, wherein the supplying a first washing liquid to the entire top surface of the first film is performed during the first substrate is rotated.

7. The method according to claim 2, further comprising heating the first substrate after the first washing liquid is supplied to the entire top surface of the first film before the using the exposure apparatus.

8. The method according to claim 2, wherein the chemically amplified resist has reactivity with ArF light.

9. The method according to claim 2, wherein the preparing has coating the photosensitive film above the first substrate.

10. The method according to claim 2, further comprising heating the first film before the first washing liquid is supplied to the entire top surface of the first film.

11. The method according to claim 2, further comprising heating the first film which the energy rays are emitted to before the developing the photosensitive film.

12. The method according to claim 1, wherein the first film comprises a protective film above the photosensitive film.

13. The method according to claim 2, wherein the first film comprises a protective film above the photosensitive film.

14. The method according to claim 6, wherein the first film comprises a protective film above the photosensitive film.

15. The method according to claim 1, further comprising supplying a water onto the first substrate after the developing the photosensitive film is started.

16. The method according to claim 1, wherein the supplying a first washing liquid to the entire top surface of the first film is performed during the first substrate is rotated.

17. The method according to claim 2, wherein the photosensitive film pattern comprises a line and space pattern.

18. The method according to claim 2, wherein the optical acid generating material contained in the surface of the resist film is partly removed by supplying the first washing liquid to the first film.

19. The method according to claim 2, wherein the resist film comprises alicyclic resin.

20. The method according to claim 2, wherein the first film comprises SOG film.

21. The method according to claim 2, wherein the emitting energy rays to the photosensitive film using the exposure apparatus is carried out by step and repeat operation.

22. The method according to claim 6, wherein the emitting energy rays to the photosensitive film using the exposure apparatus is carried out by step and repeat operation.

23. The method according to claim 13, wherein the emitting energy rays to the photosensitive film using the exposure apparatus is carried out by step and repeat operation.

24. The method according to claim 14, wherein the emitting energy rays to the photosensitive film using the exposure apparatus is carried out by step and repeat operation.

* * * * *